United States Patent
Cao

(10) Patent No.: US 10,495,920 B2
(45) Date of Patent: Dec. 3, 2019

(54) COLOR FILTER SUBSTRATE AND METHOD OF MANUFACTURING THE SAME

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Wu Cao, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 88 days.

(21) Appl. No.: 15/749,376

(22) PCT Filed: Jan. 2, 2018

(86) PCT No.: PCT/CN2018/070059
§ 371 (c)(1),
(2) Date: Jan. 31, 2018

(87) PCT Pub. No.: WO2019/104825
PCT Pub. Date: Jun. 6, 2019

(65) Prior Publication Data
US 2019/0163011 A1   May 30, 2019

(30) Foreign Application Priority Data

Nov. 29, 2017  (CN) .......................... 2017 1 1221520

(51) Int. Cl.
*G02B 5/20* (2006.01)
*G02F 1/1335* (2006.01)
*G03F 1/32* (2012.01)
*G03F 7/00* (2006.01)
*G02B 5/22* (2006.01)

(52) U.S. Cl.
CPC ....... *G02F 1/133516* (2013.01); *G02B 5/223* (2013.01); *G02F 1/133512* (2013.01); *G03F 1/32* (2013.01); *G03F 7/0007* (2013.01)

(58) Field of Classification Search
CPC ....... G03F 7/0007; G02B 5/201; G02B 5/223; G02F 1/133512; G02F 1/133514; G02F 1/133516
USPC .............................. 430/7; 349/106
See application file for complete search history.

(56) References Cited

U.S. PATENT DOCUMENTS

| | | | | |
|---|---|---|---|---|
| 2006/0055846 A1* | 3/2006 | Roh | .................. | G02F 1/133512 349/106 |
| 2008/0241429 A1* | 10/2008 | Chen | .................. | G02F 1/133516 428/1.3 |
| 2015/0338702 A1* | 11/2015 | Xie | .................. | G02F 1/133516 349/106 |

* cited by examiner

*Primary Examiner* — John A McPherson
(74) *Attorney, Agent, or Firm* — Hemisphere Law, PLLC; Zhigang Ma

(57) ABSTRACT

The disclosure provides a color filter substrate and a method thereof, comprising: a substrate, and a plurality of color filters and black matrix formed on the substrate; wherein at least one of the color filters and the black matrix form a partially overlapped structure, and a lateral contour of the film at the structure is a concave curve. By controlling a difference in an energy received by the photosensitive resin during the exposure, the taper angle of the top of the color filter is reduced, and the lateral contour is the concave curve which middle part is a pit, and the position of the concave curve is apt to produce the horns, which can effectively improve the horns bulged in the greater thickness of LCD of the organic thin film overlapped, and using a general FTM mask leads to a substantial reduction in cost, and high process controllability.

9 Claims, 3 Drawing Sheets

COLOR FILTER SUBSTRATE AND METHOD OF MANUFACTURING THE SAME

RELATED APPLICATIONS

The present application is a National Phase of International Application Number PCT/CN2018/070059, filed Jan. 2, 2018, and claims the priority of China Application No. 201711221520.5, filed Nov. 29, 2017.

FIELD OF THE DISCLOSURE

The disclosure relates to a screen display technical field, and more particularly to a color filter substrate and a method of manufacturing the same.

BACKGROUND

Commonly used masks in a photo of a liquid crystal display comprise a full tone mask (FTM) containing only 0 and 100% transmittance, and a gray tone mask (GTM), which utilizes a line pattern of a periodic arrangement of high-precision and small critical dimension (CD) to uniformly reduce the transmittance of an area, and there are also half tone masks (HTMs) forming a desired transmittance between 0 and 100%, that are formed through a special process to create a semipermeable membrane in a specific area. BPS 1Tone technology patterns an organic photosensitive resin containing a black dye by using FTM, and a single pass forms a photoresist spacer (PS) and a black matrix (BM). Because of a great thickness of a film coating, in an absence of an intermediate transmittance region, a height of a light shielding area of the BM is too large, which is a manufacturing risk point.

For a situation of a continuous overlapped color resist CF or an organic film PFA leveling, a BM barrier is easily formed when coating a thick BPS film because the FTM has no semi-transmissive area and only a difference between a film formation and a non-film formation. Therefore, it is possible to dredge the color resist development into an isolated island pattern, and use a terrain pit to reduce an overall height of the BPS in the area. However, to ditch the color-resisting area such as the data line, it is still necessary to cover the BM to shield the light, in this case, the width CD of the BM needs to be controlled: too narrow will result in a light leakage, and too wide will result in an overlapping horn bulge, which makes a local area more rugged; but in order to avoid the light leakage and offset a deviation of a machine, generally a larger width of a design is chosen, so a horn bulge is difficult to avoid, in serious situation, it will produce the risk.

There are other methods to have a composite film of different photosensitive properties, formed by an exposure of an image with a small inclination to further reduce the height of the BM, but a controllability of the process is low, and time and cost is high.

SUMMARY

A technical problem to be solved by a present disclosure is to provide a color filter substrate and a method of manufacturing the same, so as to solve a problem of a horn when two organic thin films are overlapped and improve a quality of a liquid crystal display product.

In order to solve an above technical problem, the present disclosure provides the color filter substrate comprising:

A substrate, and a plurality of color filters and black matrices formed on the substrate;

At least one of the color filters and the black matrix form a partially overlapped structure, and a lateral contour of the color filter at the partially overlapped structure is a concave curve.

Wherein, a middle of the concave curve is recessed downward to form a pit.

Wherein, a color resist is partially overlapped with the black matrix all around, and the pit is annular pit surrounding the color filter.

Wherein, an adjacent two color filters form a second partially overlapped structure, and the lateral contour of the color filter at the second partially overlapped structure is the concave curve.

Wherein, a first color filter and a second color filter separated from each other and having different colors are formed on the substrate, and a light shielding portion is provided between the first color filter and the second color-resisting and an insulating layer is provided on the light shielding portion, and the black matrix is formed on the first color filter, the second color filter, and the insulating layer, and forming the partially overlapped structure with the first color filter and the second color filter respectively, and the lateral contour of the first color filter and the second color filter at the partially overlapped structures are concave curves.

Wherein, the light shielding portion is a metal of a data line or a scan line.

The present disclosure further provides a method for manufacturing a color filter substrate, comprising:

Providing the substrate;

Forming the color filter on the substrate;

Providing a slit mask or a half-tone mask, and exposing and developing at least one color filter so that the lateral contour of an etched color filter is formed the concave curve;

Forming the black matrix on the substrate, and the black matrix partially overlapping on the lateral contour of the color filter and forming on the concave curve of the color filter.

Wherein, the slit mask comprises an opaque area, a light-transmitting area and a first translucent area located between the opaque area and the light-transmitting area, and the opaque area is completely opaque, the light-transmitting area is 100% transparent, a light transmittance of the first translucent area is between the two, when the color filter is exposed by using the slit mask, the color filter corresponding to the first translucent area partially reacts to form a lateral contour of the concave curve by etching.

Wherein, a width of a light shielding strip in the middle area of the first translucent area is greater than a width ratio of the light transmitting, and exposing the color filter by using a mask to make the lateral contour of the color filter be recessed downward to form a pit.

Wherein, the half-tone mask comprises a second translucent area which the light transmittance is less than 50%, when the color filter is exposed by using the half-tone mask, the color filter corresponding to the second translucent area partially reacts to form the lateral contour of the concave curve by etching.

The beneficial effects of the embodiments of the present disclosure are that: by controlling a difference in an amount of energy received by a photosensitive resin during an exposure, an taper angle of a top of the color filter is reduced, and the lateral contour is the concave curve, and further the middle of the concave curve is recessed downward to form the pit, and a position of the concave curve corresponds to the position where the horns are apt to occur in a process, which can effectively improve the greater thickness of the LCD of the organic thin film overlapped in the situation of the horns bulged; and it can use a general FTM mask, which leads to a substantial reduction in manufacturing costs, and high process controllability.

BRIEF DESCRIPTION OF THE DRAWINGS

To describe the technical solutions in the embodiments of the present disclosure or in the prior art more clearly, the following briefly introduces the accompanying figures required for describing the embodiments or the prior art; apparently, the accompanying figures in the following description show merely some embodiments of the present disclosure, and persons of ordinary skill in the art may still derive other figures from these accompanying figures without creative efforts.

DETAILED DESCRIPTION OF PREFERRED EMBODIMENTS

The following description of various embodiments is made with reference to the accompanying figures to illustrate specific embodiments in which the disclosure may be practiced.

Figure 1:
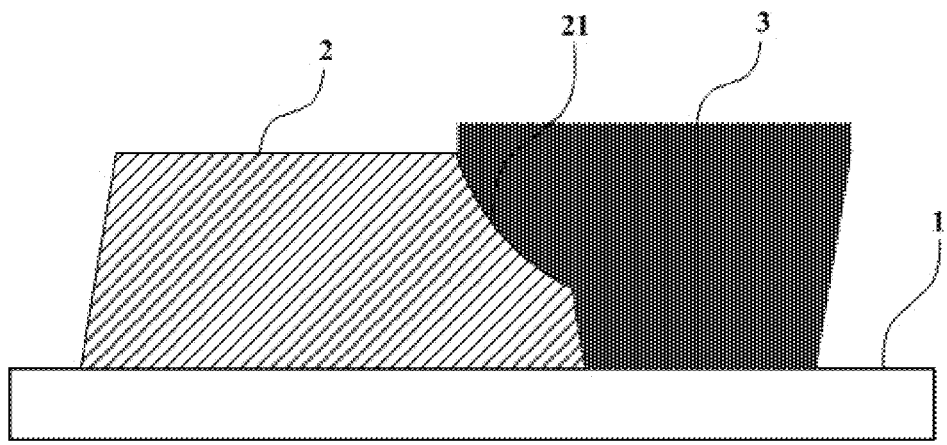
FIG. 1 is a structural schematic side view of a color filter substrate according to an embodiment 1 of the present disclosure.

See FIG. 1, an embodiment 1 of the present disclosure provides a color filter substrate, comprises:

A substrate 1, and a plurality of color filters 2 and black matrixes 3 formed on the substrate 1;

At least one of the color filter 2 and the black matrix 3 form a partially overlapped structure, and a lateral contour of the color filter 2 at the partially overlapped structure is a concave curve 21.

In the embodiments of the present disclosure, by controlling a difference in an amount of energy received by a photosensitive resin during an exposure, an taper angle of a top of the color filter is reduced, and the lateral contour is the concave curve, and further a middle of the concave curve is recessed downward to form a pit, and a position of the concave curve corresponds to the position where the horns are apt to occur in a process, which can effectively improve the greater thickness of the LCD of the organic thin film overlapped in the situation of the horns bulged.

As it can be seen from FIG. 1, the cross-sectional taper angle of the color filter 2 has been reduced, a thickness of the color filter 2 has a gradient from high to low, and the gradient of a change is gentle, and the change in CD loss at the top of the color filter 2 can be offset by overlapped film, minimizing an impact on an original design.

Figure 2:
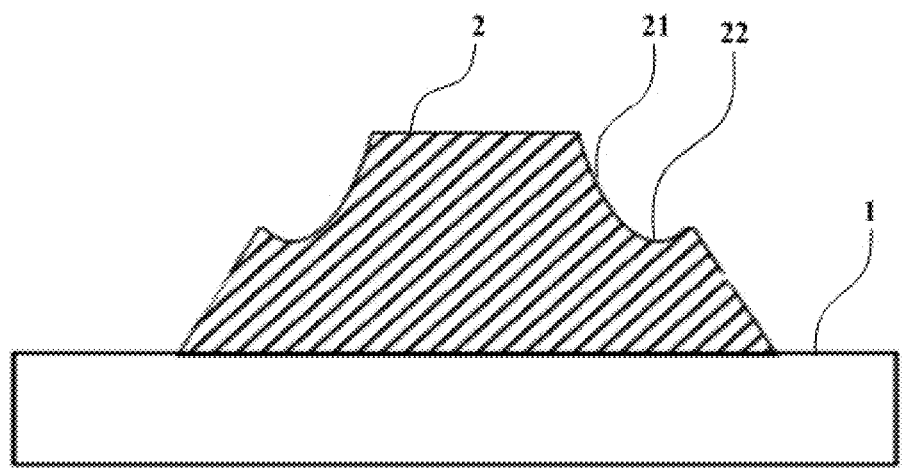
FIG. 2 is an another structural schematic diagram of a color filter according to an embodiment of the present disclosure.

Further, as shown in FIG. 2, the middle of the concave curve 21 is recessed downward to form the pit 22.

If the color filter 2 needs to be partially overlapped with the black matrix 3 all around, and the pit is annular pit 22 surrounding the color filter 2.

The embodiments of the present disclosure are suitable for improving the problem of the horn bulge when two kinds of the organic thin films overlap with each other; therefore, the two kinds of the organic thin films are not limited to an aforementioned color filter and black matrix, and comprise two adjacent color filters. Specifically, the adjacent two color filters form a second partially overlapped structure, and the lateral contour of the color filter at the second partially overlapped structure is the concave curve. Further, the middle of the concave curve is recessed downward to form the pit.

Figure 3:
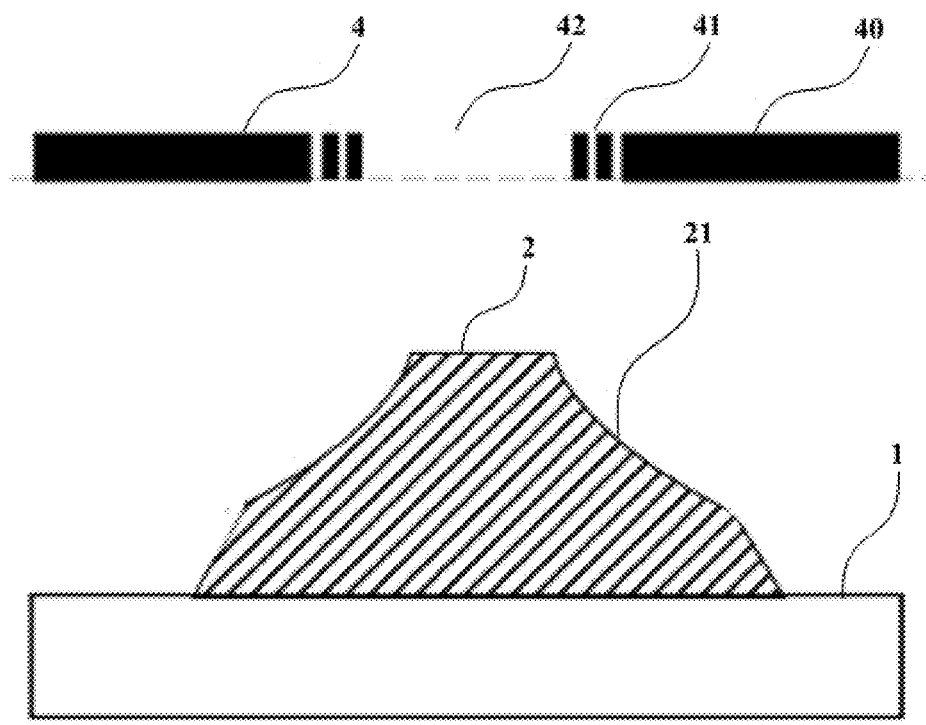
FIG. 3 is a schematic view of forming a lateral contour of a color filter with a slit mask according to an embodiment of the present disclosure.

It should be illustrated that the "concave curve" in this embodiment refers to a curve curved inwardly into the color filter 2, such as the concave curve 21 shown in FIG. 3; in some embodiments, the concave curve may also be the pit 22 with the middle portion facing downward (that is, toward the substrate 1), and the concave curve 21 is shown in FIG. 2.

See FIG. 3 again, the color filter 2 of this embodiment uses a mask with a plurality of light transmittance during a manufacturing process to expose and develop, after etched, the lateral contour of the color filter is formed the concave curve. Specifically, the color filter 2 is first coated on the substrate 1, and then the mask 4 with a plurality of light transmittance is provided, and the mask 4 comprises three types of areas with different light transmittance to control an exposure at different positions: an opaque area 40, a light-transmitting area 42, and a translucent area 41 between the opaque area 40 and the light-transmitting area 42, and the opaque area is completely opaque, the light-transmitting area is 100% transparent, a light transmittance of the translucent area is between the two. When the color filter 2 is exposed, the translucent area 41 corresponding to the color filter 2 partially reacts to form the lateral contour of the concave curve by etching.

As an example, in this embodiment, the mask 4 may be a slit mask, that is, the translucent area 41 is designed to be arranged between light-transmitting strips and light-shielding strips, so as to reduce an amount of light transmitted through a first translucent area 41 as a whole. For the concave curve 21 shown in FIG. 1, the light-transmitting strips and the light-shielding strips in the first translucent area 41 are designed to be equal in the width so that the thickness of the color filter 2 gradually changes from high to low, and the gradient of the change is gentle. In the concave curve 21 shown in FIG. 2, the middle portion of the concave curve 21 is recessed downward to form the pit 22, and in the design of the light-transmitting strips and the light-shielding strips arranged in the first translucent area 41, and the width of the light-shielding strips in the middle area is larger than the width of the light-transmitting strips so that the amount of light transmission in the middle area (corresponding to the pit 22) of the first translucent area 41 is relatively minimum and the film forming height is the lowest so as to form the pits 22.

In this embodiment, when the specific design of the mask 4 arranges with the larger minimum line width CD, the usual FTM mask is designed the light-transmitting strips and the light-shielding strips arranged alternately with each other, so that a manufacturing difficulty is small and the manufacturing cost is not increased, and the widths of the light-transmitting strips and the light-shielding strips can be the same or different, and the minimum line width CD meets a design requirement of the FTM.

Figure 4:
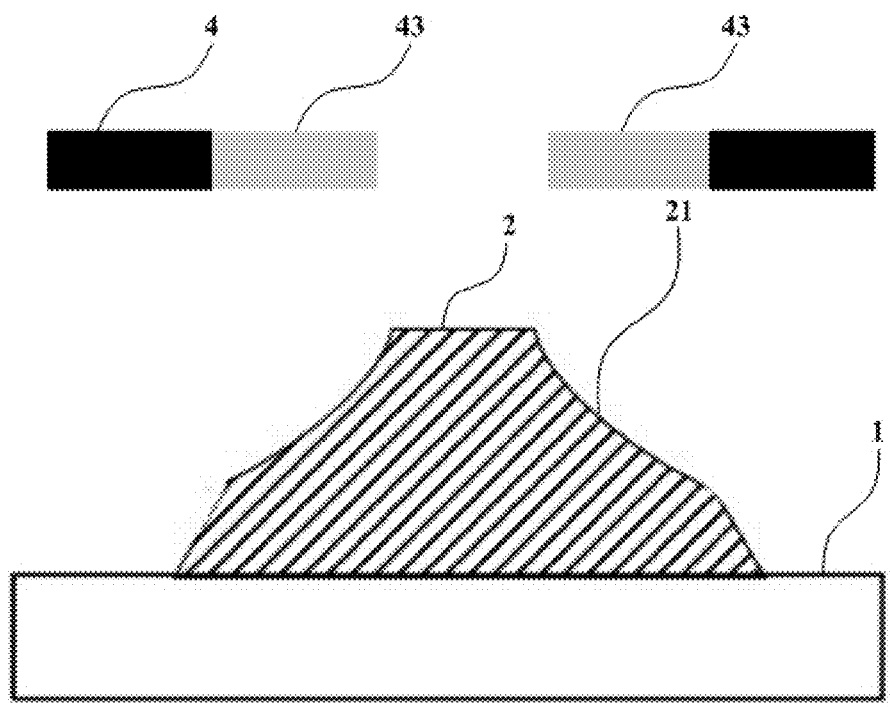
FIG. 4 is a schematic view of forming a lateral contour of a color filter with a half-tone mask according to an embodiment of the present disclosure.

As the example, in this embodiment, the mask 4 may also be a half tone mask, as shown in FIG. 4, the mask 4 comprises the second translucent area 43 which the light transmittance is less than 50%, when the color filter 2 is exposed and developed, the color filter 2 corresponding to the second translucent area 43 partially reacts to form the lateral contour of the concave curve 21 by etching, which the thickness gradient is from high to low. For the pit 22 formed by recessing the middle portion of the concave curve 21 shown in FIG. 2, the light transmittance of the second translucent area 43 can be lower to reduce the light transmittance of the second translucent area 43, and to reduce the film formation height and form pits 22.

Figure 5:
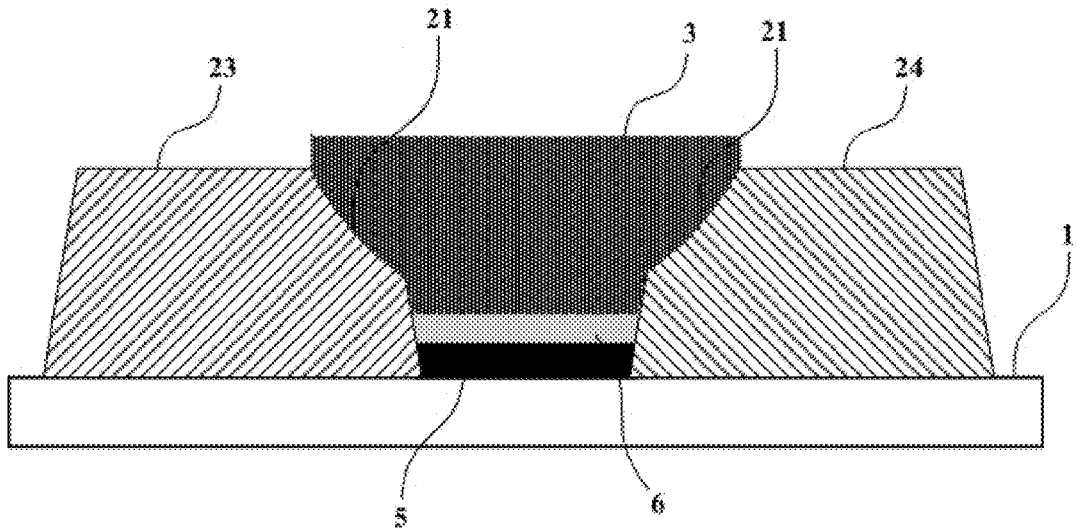
FIG. 5 is an another structural schematic side view of a color filter substrate according to an embodiment 1 of the present disclosure.

See FIG. 5, which is an another structural schematic side view of the color filter substrate according to the embodiment 1 of the present disclosure. The first color filter 23 and the second color filter 24 separated from each other and having different colors are formed on the substrate 1, and the light shielding portion 5 is provided between the first color filter 23 and the second color filter 24, according to practical applications, the light shielding portion 5 is a metal of a data line or a scan line, providing an insulating layer 6 on the light shielding portion 5, and forming the black matrix 5 on the first color filter 23, the second color filter 24 and the insulating layer 6, and forming the partially overlapped structure with the first color filter 23 and the second color filter 24 respectively, and the lateral contour of the first color filter 23 and the second color filter 24 at the partially overlapped structures are concave curves 21. Compared with the prior art, the first color filter 23 and the second color filter 24 are formed on the light shielding portion 5, the above structure can not only reduce the height of the color filter and the black matrix as a whole but also solve the problem of the horn bulge caused by the overlap of the color filter and the black matrix.

Figure 6:
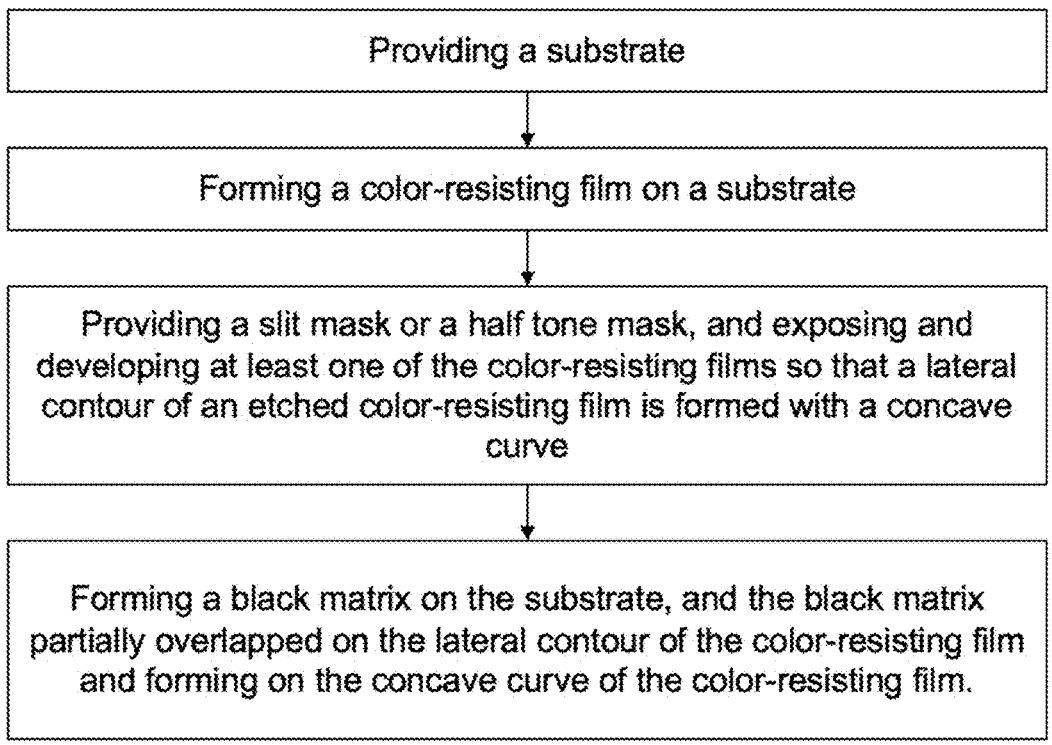
FIG. 6 is a schematic flow chart of a method for manufacturing a color filter substrate according to an embodiment 2 of the present disclosure.

See FIG. 6, corresponding to the embodiment 1 of the present disclosure, the embodiment 2 of the present disclosure provides a method of manufacturing a color filter substrate, comprising:

Providing the substrate;

Forming the color filter on the substrate;

Providing the slit mask or the half tone mask, and exposing and developing at least one of the color filter so that the lateral contour of an etched color filter is formed with the concave curve;

Forming the black matrix on the substrate, and the black matrix partially overlapping on the lateral contour of the color filter and forming on the concave curve of the color filter.

Since the lateral contour of the color filter is the concave curve, when the black matrix portion is partially overlapped, an existing horn bulge will be offset by the concave curve so that the height of the horn overlapped decreases.

Further, the slit mask comprises the opaque area, the light-transmitting area and the first translucent area located between the opaque area and the light-transmitting area, and the opaque area is completely opaque, the light-transmitting area is 100% transparent, a light transmittance of the first translucent area is between the two, when the color filter is exposed by using the slit mask, the color filter corresponding to the first translucent area partially reacts to form a lateral contour of the concave curve by etching.

Further, the width of the light shielding strip in the middle area of the first translucent area is greater than a width ratio of the light transmitting, and exposing the color filter by using the mask to make the lateral contour of the color filter be recessed downward to form a pit.

Further, the half tone mask comprises the second translucent area which the light transmittance is less than 50%, when the color filter is exposed by using the half-tone mask, the color filter corresponding to the second translucent area partially reacts to form the lateral contour of the concave curve by etching.

It can be seen from the above description that the beneficial effects of the embodiments of the present disclosure are:

By controlling the difference in the amount of energy received by the photosensitive resin during the exposure, the taper angle of the top of the color filter is reduced, and the lateral contour is the concave curve, and further the middle of the concave curve is recessed downward to form the pit, and the position of the concave curve corresponds to the position where the horns are apt to occur in the process, which can effectively improve the greater thickness of the LCD of the organic thin film overlapped in the situation of the horns bulged; and it can use a general FTM mask, which leads to a substantial reduction in manufacturing costs, and high process controllability.

The above disclosure is only the preferred embodiments of the present disclosure, and certainly can not be used to limit a scope of the present disclosure; therefore, equivalent changes were made according to the claims of the present disclosure are still within the scope of the present disclosure.

What is claimed is:

1. A color filter substrate, comprising:
   a substrate, and a plurality of color filters and black matrices formed on the substrate;
   wherein at least one of the color filters and the black matrix form a partially overlapped structure, and a lateral contour of the color filter at the partially overlapped structure is a concave curve,
      wherein an adjacent two color filters form a second partially overlapped structure, and the lateral contour of the color filter at the second partially overlapped structure is the concave curve.

2. The color filter substrate according to claim 1, wherein a middle of the concave curve is recessed downward to form a pit.

3. The color filter substrate according to claim 2, wherein the color filter is partially overlapped with the black matrix all around, and the pit is annular pit surrounding the color filter.

4. The color filter substrate according to claim 1, wherein a first color filter and a second color filter separated from each other and having different colors are formed on the substrate, a light shielding portion is provided between the first color filter and the second color filter, and an insulating layer is provided on the light shielding portion; and the black matrix is formed on the first color filter, the second color filter, and the insulating layer, and forming the partially overlapped structure with the first color filter and the second color filter respectively; and the lateral contour of the first color filter and the second color filter at the partially overlapped structures are concave curves.

5. The color filter substrate according to claim 4, wherein the light shielding portion is a metal of a data line or a scan line.

6. A method for manufacturing a color filter substrate, comprising:
    providing a substrate;
    forming color filters on the substrate;
    providing a slit mask or a half tone mask, and exposing and developing at least one of the color filters so that a lateral contour of an etched color filter is formed with a concave curve;
    forming black matrices on the substrate, and the black matrix partially overlapped on the lateral contour of the color filter and forming on the concave curve of the color filter.

7. The manufacturing method according to claim 6, wherein the slit mask comprises an opaque area, a light-transmitting area and a first translucent area located between the opaque area and the light-transmitting area, and the opaque area is completely opaque, the light-transmitting area is 100% transparent, a light transmittance of the first translucent area is between the two, when the color filter is exposed by using the slit mask, the color filter corresponding to the first translucent area partially reacts to form a lateral contour of the concave curve by etching.

8. The manufacturing method according to claim 7, wherein a width of a light shielding strip in a middle area of the first translucent area is greater than a width ratio of the light transmitting, and exposing the color filter by using a mask to make the lateral contour of the color filter be recessed downward to form a pit.

9. The manufacturing method according to claim 6, wherein the half tone mask comprises a second translucent area which the light transmittance is less than 50%, when the color filter is exposed by using the half-tone mask, the color filter corresponding to the second translucent area partially reacts to form the lateral contour of the concave curve by etching.

* * * * *